(12) United States Patent
Dwivedi et al.

(10) Patent No.: US 8,453,073 B1
(45) Date of Patent: May 28, 2013

(54) METHOD OF MASK GENERATION FOR INTEGRATED CIRCUIT FABRICATION

(75) Inventors: ShriSagar Dwivedi, San Jose, CA (US); Puneet Sawhney, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/418,480

(22) Filed: Mar. 13, 2012

(51) Int. Cl.
*G06F 17/50* (2006.01)
*G03F 9/00* (2006.01)

(52) U.S. Cl.
USPC ............... 716/50; 716/119; 716/54; 430/5; 430/30

(58) Field of Classification Search
USPC .......................................... 716/50, 54; 430/5
See application file for complete search history.

(56) References Cited

U.S. PATENT DOCUMENTS

| | | | | |
|---|---|---|---|---|
| 6,567,964 | B2* | 5/2003 | Shin et al. | 716/55 |
| 7,014,955 | B2* | 3/2006 | Chang et al. | 430/5 |
| 7,673,271 | B1* | 3/2010 | Becker et al. | 716/101 |
| 7,984,393 | B2* | 7/2011 | Aton et al. | 716/54 |
| 8,193,830 | B2* | 6/2012 | Schmit et al. | 326/38 |
| 2002/0116686 | A1* | 8/2002 | Shin et al. | 716/2 |
| 2004/0117755 | A1* | 6/2004 | Blodget et al. | 716/17 |
| 2005/0193358 | A1* | 9/2005 | Blodget et al. | 716/17 |
| 2009/0307640 | A1* | 12/2009 | Chapman et al. | 716/4 |
| 2011/0289470 | A1* | 11/2011 | Bickford et al. | 716/132 |
| 2012/0240088 | A1* | 9/2012 | Guo et al. | 716/104 |

* cited by examiner

*Primary Examiner* — Jack Chiang
*Assistant Examiner* — Magid Dimyan
(74) *Attorney, Agent, or Firm* — Nixon & Vanderhye P.C.

(57) ABSTRACT

A method of generating a mask for fabrication of a physical layer of an integrated circuit is provided. Multiple design layers are provided which comprise a programmable subcomponent configuration layer defining logical configurations of programmable subcomponents. A mask generation procedure transforms a selected design layer into a mask for fabrication of a physical layer. A mask modification procedure amends the mask to ensure that the physical layer will be reliably fabricated when using the mask. A non-functional design layer which does not represent one of said multiple physical layers represents further possible positions for said set of physical structures in said selected physical layer, which are not represented in said programmable subcomponent configuration layer. The mask modification procedure treats the non-functional design layer as a programmable subcomponent configuration layer. This enables the programmable subcomponent configuration layer to be modified without affecting the masks previously generated for other physical layers.

18 Claims, 9 Drawing Sheets

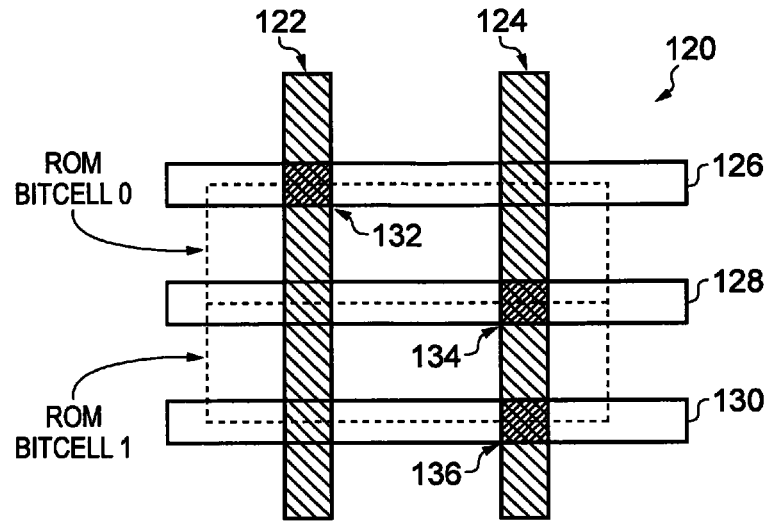
FIG. 5
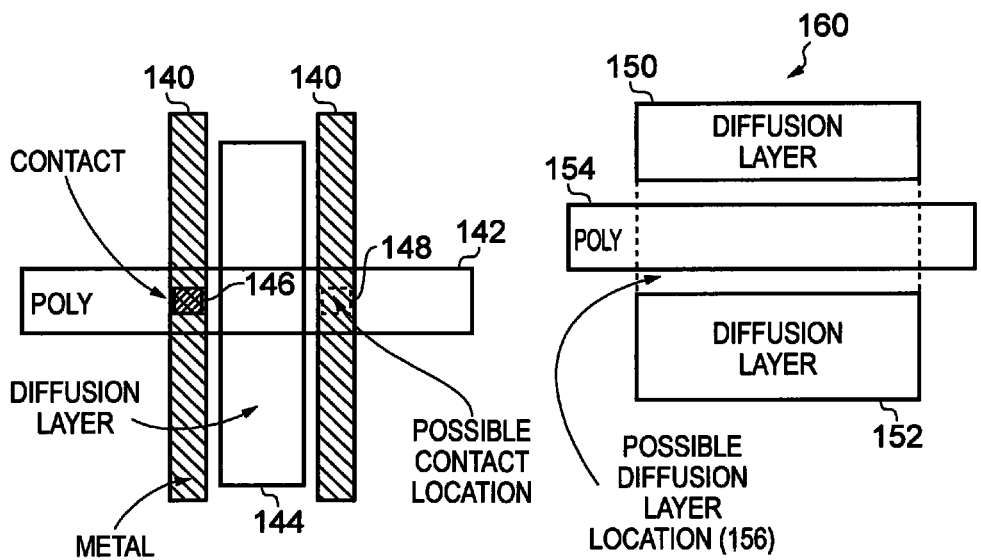
FIG. 6
FIG. 7

METHOD OF MASK GENERATION FOR INTEGRATED CIRCUIT FABRICATION

BACKGROUND OF THE INVENTION

1. Field of the Invention

The present invention relates to a method of generating a mask for fabrication of a physical layer of an integrated circuit. More particularly, the present invention relates to a method of generating such a mask for fabrication of an integrated circuit which comprises multiple physical layers.

2. Description of the Prior Art

The fabrication of a contemporary integrated circuit is a complex process involving many stages and participants. Typically, the designer of an integrated circuit sets out a definition of the integrated circuit comprising a layout design for each physical layer of the integrated circuit, wherein a contemporary integrated circuit typically comprises many physical layers (e.g. multiple metal layers, polysilicon layers, diffusion layers, via layers, contact layers and so on). This definition of the integrated circuit (for example in the form of a gds2 file) is then provided to a dedicated manufacturing facility which has the ability to turn this computer-generated multi-layer design of an integrated circuit into the fabricated integrated circuit itself.

The fabrication process itself is highly specialised and complex, but of relevance here is the mask generation procedure which transforms the designed layout of a given layer of the integrated circuit into a photolithographic mask to be used in the photolithography procedure of using incident light filtered by the mask to etch the desired design layout for that given layer of the integrated circuit.

As the process scales at which contemporary integrated circuits are generated get ever smaller, it is known that the layout of the mask for a given layer of the integrated circuit is not generated as having an identical layout to the desired layout of the physical structure of that layer, but rather the mask is modified (for example according to optical proximity correction techniques) to ensure that the physical structures which remain after the photolithography has taken place will reliable reflect the designer's intention. Such techniques are necessary because of, for example, diffraction effects resulting from the scale of the apertures in the mask being of a comparable scale to the wavelength of the incident light.

It is also known for an integrated circuit to have programmable subcomponents, wherein each programmable subcomponent of the integrated circuit can take a number of logical configurations in dependence of the position of one or more physical structures in a given physical layer of the integrated circuit within that subcomponent. For example, it is known to construct a read-only memory (ROM) within an integrated circuit, wherein the logical value stored within each ROM bit cell is determined by the selected positions of vias within that ROM bit cell which connect a first metal layer to a second metal layer.

In the case of an integrated circuit comprising programmable subcomponents, it is also known to be the case that the integrated circuit is designed, taped out as a finalised layout of each physical layer of the integrated circuit and provided to the foundry for generation of the masks for each physical layer of the integrated circuit, but it is then found that the programming of the programmable subcomponents should be amended. For example in the case of an integrated circuit providing a ROM, it may be desired to change the programmed content of the ROM. Accordingly the layout of the physical structures in the relevant layer (e.g. via layer) of the integrated circuit is then reconfigured and the foundry is required to regenerate the mask for that particular layer.

SUMMARY OF THE INVENTION

Viewed from a first aspect, the present invention provides a method of generating a mask for fabrication of a physical layer of an integrated circuit, wherein said integrated circuit comprises multiple physical layers, the method comprising the steps of: receiving an input definition of said integrated circuit comprising multiple design layers, each design layer of said multiple design layers representing a designed layout of one of said multiple physical layers, wherein said multiple design layers comprise a programmable subcomponent configuration layer, said programmable subcomponent configuration layer representing a set of physical structures in a selected physical layer of said integrated circuit, wherein a position of each physical structure of said set of physical structures determines which of a plurality of logical configurations a programmable subcomponent of said integrated circuit will have; performing a mask generation procedure on a selected design layer of said multiple design layers, said mask generation procedure comprising transforming said selected design layer into said mask for fabrication of said physical layer of said integrated circuit; and performing a mask modification procedure on said mask, said mask modification procedure comprising amending said mask to ensure that said physical layer of said integrated circuit will be reliably fabricated when using said mask, wherein said input definition of said integrated circuit further comprises a non-functional design layer, wherein said non-functional design layer does not represent one of said multiple physical layers, and wherein said non-functional design layer represents further possible positions for said set of physical structures in said selected physical layer, said further possible positions not being represented in said programmable subcomponent configuration layer, and wherein said mask modification procedure comprises treating said non-functional design layer as said programmable subcomponent configuration layer.

The method is related to the fabrication of an integrated circuit comprising multiple physical layers, wherein a physical layer is constructed in accordance with provided design layer which sets out the designed layout of the corresponding physical layer. In particular, the multiple design layers provide a programmable subcomponent configuration layer which defines the positions of a set of physical structures in a physical layer of the integrated circuit. The position of each of those physical structures determines which of a plurality of logical configurations a programmable subcomponent of the integrated circuit will have. In other words, the integrated circuit comprises programmable subcomponents (for example these could in one embodiment be ROM bit cells) and the position of each physical structure (for example in one embodiment these could be vias) define the logical configuration of that programmable subcomponent (in the example of a ROM bit cell, this corresponding to the value stored in the ROM bit cell).

As process scales of contemporary integrated circuits have become ever smaller, the inventors of the present invention have found that modification of a given layer of the integrated circuit (such as a via layer) which defines the programmed content of programmable subcomponents (e.g. the bit cells of a ROM device) not only results in the corresponding change the mask for that via layer, but the masks of other layers can also be affected by the change to the programmable content. For example, where a via-ROM has its programmable content defined by the positions of vias within a via layer, these vias connected a first and second metal layer to one another, variations in the position of those vias can cause changes to the first and second metal layer to be necessary. For example, contemporary optical proximity correction techniques can result in the enlargement of metal structures in a metal layer at a position where a via is placed (to ensure reliable contact between the via and the metal layer). Accordingly, repositioning the via can result in corresponding changes in position of those optical proximity correction generated enlargements in the given metal layer.

This could be disadvantageous, because it is desirable to be able to change the programmable content of programmable subcomponents of an integrated circuit even at this late stage in the process of fabricating an integrated circuit (whether due to legitimate design changes or due to the late identification of errors). If it were necessary to amend several masks, rather than just the one mask corresponding to the programmable layer which has been altered, such late stage amendments to the programmable content would be very expensive.

To address this problem, the method further comprises a non-functional design layer in the input definition of the integrated circuit. This non-functional design layer does not correspond to one of the multiple physical layers of the integrated circuit as such, in that it is not subjected to the mask generation procedure itself for the purpose of fabricating a corresponding physical layer of the integrated circuit. However, the non-functional design layer is associated with the programmable sub-component configuration layer in that it represents further possible positions for the set of physical structures in the selected physical layer to be manufactured according to the programmable sub-component configuration layer. In other words, the non-functional design layer represents positions for the set of physical structures which are not used in the programmable subcomponent configuration layer.

The process of generating a mask for a selected design layer of the integrated circuit to create a mask for fabrication (e.g. by photolithography) of the physical layer of the integrated circuit comprises a mask modification procedure which comprises making adjustments to the mask to ensure that the physical layer will be reliably fabricated when using that mask. For example, in one embodiment this mask modification procedure could comprise optical proximity correction techniques. Importantly, the mask modification procedure comprises treating the non-functional design layer as a programmable subcomponent configuration layer of the input definition of the integrated circuit. That is to say, when performing the mask modification procedure the method treats the non-functional design layer as though the physical structures it represents are present in the programmable sub-component configuration layer. This has the advantage that when a mask is generated for a given physical layer of the integrated circuit, the mask modification procedure which is carried out for that physical layer is performed not only taking into account the positions of the set of physical structures in the current design of the programmable sub-component configuration layer, but also taking into account further possible positions for that set of physical structures. This then results in the mask generated for that physical layer being already generated with the modifications necessary for other possible configurations of the programmable sub-component configuration layer.

Accordingly, even after a full set of masks has been generated for fabrication of the integrated circuit, the integrated circuit designer can change the programmable content of the programmable subcomponents of the integrated circuit (by virtue of amending the programmable subcomponent configuration layer and thus changing the positions of the set of physical structures in the corresponding physical layer of the integrated circuit), and only the mask required for fabricating this physical layer need be changed. The other masks for fabrication of other physical layers of the integrated circuit remain valid since the mask modification procedures which have been applied to those masks have already taken into the account the new positions for the set of physical structures in the programmable subcomponent configuration layer. Hence, the expensive process of changing multiple masks as a result of a re-tape out which only comprises changes to the programmable content of the programmable subcomponents of the integrated circuit is avoided and only a single mask needs to be regenerated when the programmable content is changed.

It should be recognised that the non-functional design layer could be configured in a number of ways, the only essential attribute of the non-functional design layer being that it represents positions for the physical structures in the selected physical layer which are not represented in the programmable subcomponent configuration layer. Accordingly, in one embodiment said non-functional design layer represents all possible positions for said set of physical structures in said selected physical layer. Accordingly, in such an embodiment the mask modification procedure can be performed without reference to the programmable subcomponent configuration layer and instead said mask modification procedure comprises treating said non-functional design layer in place of said programmable subcomponent configuration layer. Due to the fact that the non-functional design layer represents all possible positions for the set of physical structures, performing the mask modification procedure with reference to the non-functional design layer in this embodiment will ensure that the amended mask is prepared for any possible set of positions for the set of structures.

Alternatively, the non-functional design layer could be configured to represent positions of the set of physical structures which are not present in the programmable subcomponent configuration layer. (i.e. the non-functional design layer and the programmable subcomponent configuration layer are complementary to one another in terms of positions of physical structures), and in such an embodiment said mask modification procedure comprises treating said non-functional design layer in addition to said programmable subcomponent configuration layer.

It should be recognised that the programmable subcomponent configuration layer could take a variety of forms, so long as the position of the physical structures in that layer each configure a programmable subcomponent of the integrated circuit between a number of logical configurations. For example, in one embodiment said programmable subcomponent configuration layer represents a via layer in said integrated circuit. Thus, in this embodiment the set of physical structures are a set of vias (i.e. connections between metal layers), whose positions configure programmable subcomponents of the integrated circuit between a number of logical configurations. For example, where the integrated circuit comprises a via-ROM, the selected positions of the vias define the stored values in each ROM bit cell.

Alternatively, in another embodiment said programmable subcomponent configuration layer represents a contact layer in said integrated circuit. In this example, the programmability of the programmable subcomponents of the integrated circuit depends on the positions of the contacts (i.e. connections between metal and polysilicon or between metal and diffusion layers). This could for example be the case in the example of a contact-ROM, wherein the positions of the contacts define the stored values in each contact bit cell of the ROM.

In yet another embodiment said programmable subcomponent configuration layer represents a diffusion layer in said integrated circuit. Accordingly, in this embodiment the programmability of the programmable sub-components of the integrated circuit depends on the layout of this diffusion layer, the shape of the diffusion layer in association with a programmable subcomponent defining which logical configuration that programmable subcomponent has. For example, the presence or absence of a diffusion layer underneath a given polysilicon section can enable or disable that subcomponent. As mentioned above, the programmable subcomponent could take a variety of forms, but in one embodiment said programmable subcomponent of said integrated circuit is a memory cell and said plurality of logical configurations corresponds to values which may be stored in said memory cell. In one embodiment said memory cell is a read-only memory bit cell.

In another embodiment, said programmable subcomponent of said integrated circuit is a path selection structure and said plurality of logical configurations correspond to connection to a selected path amongst a plurality of paths. Accordingly, the positions of the set of physical structures will determine which selected path amongst a plurality of paths is connected to.

The plurality of paths could serve a number of purposes, but in one embodiment said plurality of paths comprises a range of delays. Hence, where the plurality of paths comprises a range of delays, the "programming" of this subcomponent enables a selection between this range of delays. Accordingly, an integrated circuit can be taped out before a final decision is made about a particular delay value to be applied to a particular path and adjustment of this delay value can be made by amending only the programmable subcomponent configuration layer, resulting only in a single mask being modified.

In another example embodiment, said plurality of paths comprises a range of voltage connections. Similarly to the delay example above, an integrated circuit can be taped out before a final decision is made about a particular voltage which should be supplied to a particular connection. For example, in the context of a SRAM design where the programmable subcomponents are connections to different voltage connections for Extra Margin Adjust (EMA) pins, there is then only a single mask penalty to tune the margin/performance of the SRAM design by amending the connections to these EMA pins by adjustment of a single layer (e.g. a via layer).

The mask modification procedure can comprise various techniques to ensure reliable fabrication when using the mask, but in one embodiment the mask modification comprises optical proximity correction.

The present techniques may be applied to fabrication of integrated circuits at a range of process scales, but the techniques are a particular benefit at smaller process nodes, due to the fact that the tendency for modification of a given layer to affect the required mask modification for the masks of the other layers of the integrated circuit (whether adjacent layers or even further away) increases towards smaller process scales. Accordingly in some embodiments said set of asks for fabrication of said physical layers of said integrated circuit are configured for fabrication at a process node of 28 nm or below.

Viewed from a second aspect the present invention provides a computer readable storage medium storing in a non-transitory fashion a representation of a mask generated according to the method of the first aspect.

Viewed from a third aspect the present invention provides a mask for fabrication of a physical layer of an integrated circuit generated according to the method of the first aspect.

Viewed from a fourth aspect the present invention provides a method of generating a layout design of an integrated circuit comprising multiple design layers, each design layer of said multiple design layers representing a designed layout of one of said multiple physical layers, the method comprising the steps of: providing said multiple design layers comprising a programmable subcomponent configuration layer, said programmable subcomponent configuration layer representing a set of physical structures in a selected physical layer of said integrated circuit, wherein a position of each physical structure of said set of physical structures determines which of a plurality of logical configurations a programmable subcomponent of said integrated circuit will have; and providing said multiple design layers comprising a non-functional design layer, wherein said non-functional design layer does not represent one of said multiple physical layers, and wherein said non-functional design layer represents further possible positions for said set of physical structures in said selected physical layer, said further possible positions not being represented in said programmable subcomponent configuration layer, wherein a selected design layer of said multiple design layers is configured to be subjected to a mask generation and modification procedure comprising transforming said selected design layer into a selected mask for fabrication of a corresponding physical layer of said integrated circuit and amending said selected mask to ensure that a corresponding physical layer of said integrated circuit will be reliably fabricated when using said mask, wherein said mask generation and modification procedure comprises treating said non-functional design layer as said programmable subcomponent configuration layer.

Viewed from a fifth aspect the present invention provides a computer-readable storage medium storing in a non-transitory fashion a representation of a layout design of an integrated circuit generated according to the method of the fourth aspect.

BRIEF DESCRIPTION OF THE DRAWINGS

The present invention will be described further, by way of example only, with reference to embodiments thereof as illustrated in the accompanying drawings, in which:

FIG. 5 schematically illustrates how two ROM bit cells may share a via;

FIG. 6 schematically illustrates an example programmable subcomponent whose logical configuration depends on the position of a poly-to-metal contact;

FIG. 7 schematically illustrates a programmable subcomponent whose logical configuration depends on the position of the diffusion layer;

DESCRIPTION OF THE PREFERRED EMBODIMENTS

Figure 1:
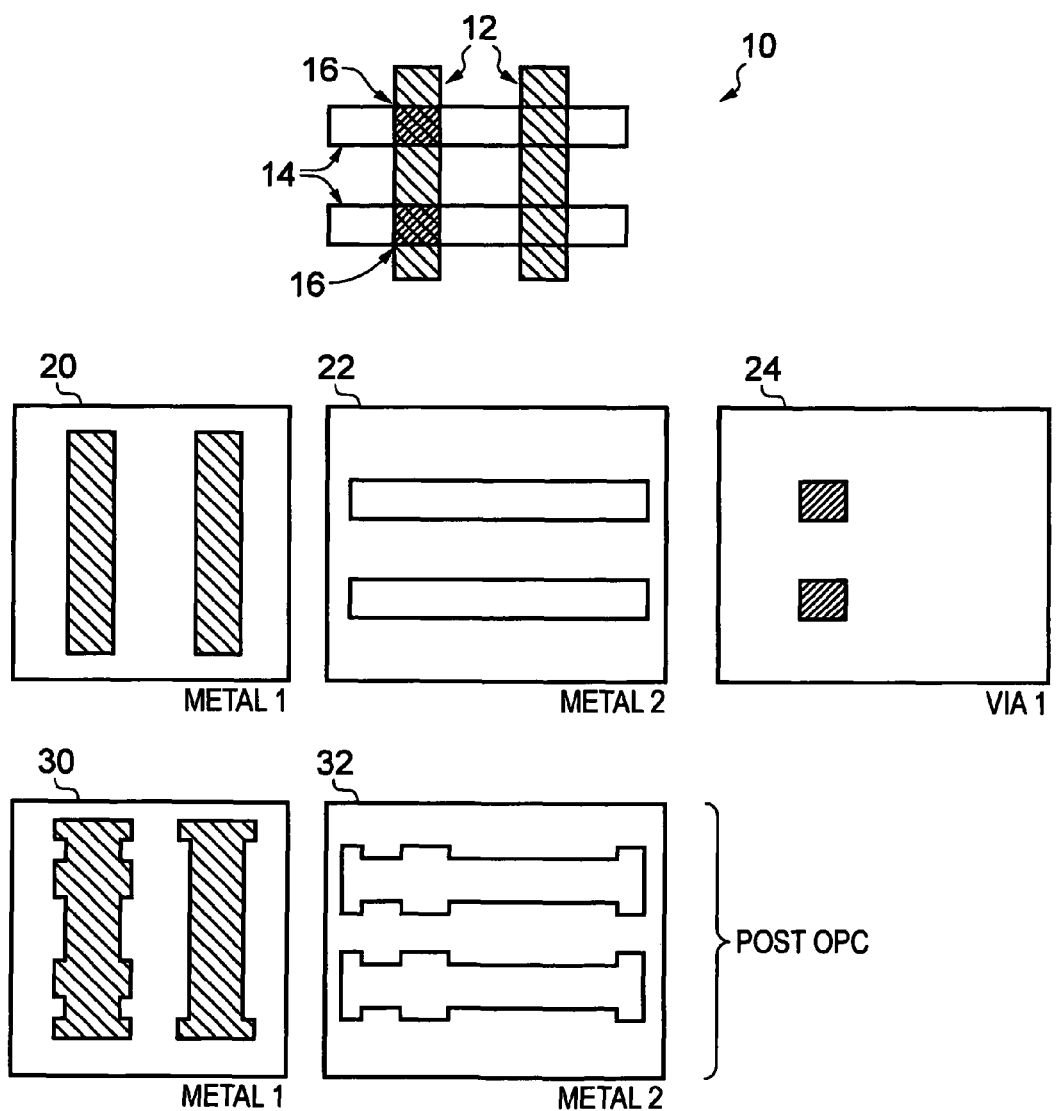
FIG. 1 schematically illustrates a mask generation and modification for a first ROM bit cell according to the prior art.

FIG. 1 schematically illustrates a ROM bitcell providing a programmable subcomponent of an integrated circuit. The ROM bit cell 10 is formed at the intersection of a portion of the metal 1 layer 12 and the metal 2 layer 14. The logical configuration of this ROM bit cell, i.e. defining whether this ROM bit cell stores a "1" or a "0" is implemented by the positioning of the vias 16 which couple metal layer 1 to metal layer 2. In order to fabricate the integrated circuit which comprises this ROM bit cell 10, design layers corresponding to the physical layers of the integrated circuit are generated by the integrated circuit designer, each design layer representing a designed layout of each corresponding physical layer. This designed definition of the integrated circuit will usually be produced in a format such as gds2 to be passed to a foundry which manufactures the corresponding mask for each physical layer of the integrated circuit in dependence on the provided design layers in the definition file. Design layers 20, 22 and 24 schematically illustrate the layout of each design layer corresponding to the ROM bit cell 10. Design layer 20 corresponds to the layout of the metal structures in the metal 1 layer, design layer 22 corresponds to the physical structures in the metal 2 layer and design layer 24 represents the vias in via layer 1. In order to construct the corresponding integrated circuit, the foundry generates a mask corresponding to each of these design layers, such that this mask can be used in photolithography to fabricate the corresponding physical layer of the integrated circuit. One of ordinary skill in the art is familiar with the detailed steps of this mask generation process and the fabrication of each individual layer of the integrated circuit and further detail is not provided here. However, one aspect of the masked generation procedure which is of particular relevance here is a mask modification procedure which is typically carried out on each generated mask to ensure that the corresponding physical layer of the integrated circuit will be reliably fabricated. For example it is known to amend the shape of the corners of a feature in a given layer (in particular to slightly enlarge these corners) such the resulting printed shape will be reliably fabricated, most notably that the electrical properties of the fabricated integrated circuit faithfully reflect the system designer's intention.

In FIG. 1 masks 30 and 32 schematically illustrate the generated masks for the metal 1 and metal 2 layers after these have been subjected to optical proximity correction (one particular kind of mask modification which may be carried out). As can be seen in FIG. 1, the corners of each of the metal layer features have been extended to form "hammer-head" type features by the optical proximity correction process. However, in addition note that another difference between the design for metal layer 20 and the generated mask 30 for the fabrication of the corresponding physical layer of the integrated circuit is that the optical proximity correction process has also enlarged two sections of this portion of the metal 1 layer which correspond to the positions of the vias in the via 1 layer. Correspondingly, the OPC process has enlarged two areas of this portion of the metal 2 layer mask 32. These enlargements, which have now been found to be necessary at small process scales, are performed such that when the integrated circuit is fabricated, a reliable connection between the metal 1 layer and the two vias in the via 1 layer; as well as a reliable connection between the metal 2 layer and the vias in the via 1 layer is produced. Without these enlargements as a result of the OPC process, variations in the fabrication process, diffraction effects, optical distortions and so on could result in an unexpectedly thin section of the relevant portion of either the metal 1 layer or the metal 2 layer, or a mispositioning of the vias with respect to either the metal 1 layer and/or the metal 2 layer, resulting in a poor or even ineffectual connection between the metal 1 layer and the vias and/or the metal 2 layer and the vias.

Figure 2:
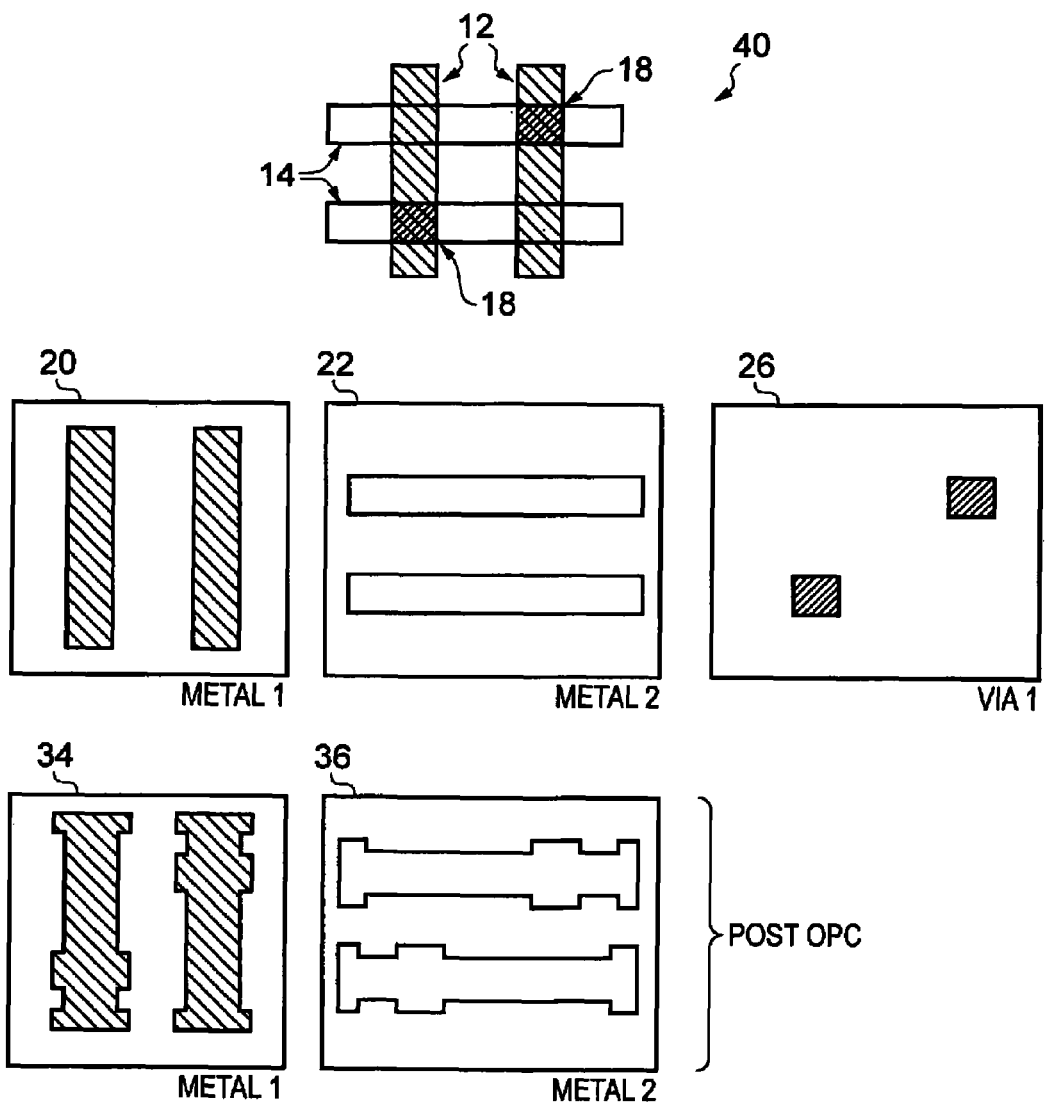
FIG. 2 schematically illustrates mask generation and modification for a second ROM bit cell according to the prior art.

FIG. 2 schematically illustrates the same ROM bit cell as that illustrated in FIG. 1, but here the ROM bit cell 40 is in another logical configuration by virtue of the position of its vias. Specifically, the metal 1 layer portions 12 and the metal 2 layer portions 14 are identical to those illustrated in FIG. 1, but in ROM bit cell 40 the vias 18 are in a different configuration, with the purpose of storing the complementary logical value in the ROM bit cell. Accordingly, it can be seen that the design layers 20 and 22 for metal layers 1 and 2 are identical to those illustrated in FIG. 1, but the design layer 26 for the via 1 layer has changed to account for the new positioning of the vias. Furthermore it can be seen in FIG. 2 that the post OPC masks generated at the foundry for the fabrication of the metal 1 and metal 2 layers 34 and 36 have the same "hammerhead" shapes at the corners of the metal layer features as masks 30 and 32 in FIG. 1, but in addition have correspondingly changed due to the changing position of the via 1 vias. Hence, if having already taped out a layout of the integrated circuit according to the illustrated example in FIG. 1, the circuit designer wishes to amend the programmed content of ROM bit cell 10 to configure it as ROM bit cell 40 in FIG. 2, not only would this require the new creation of a mask corresponding to the via 1 layer, but also to the required masks for the metal 1 and metal 2 layers because of the effect of the change in position of the via 1 vias on these masks.

Figure 3:
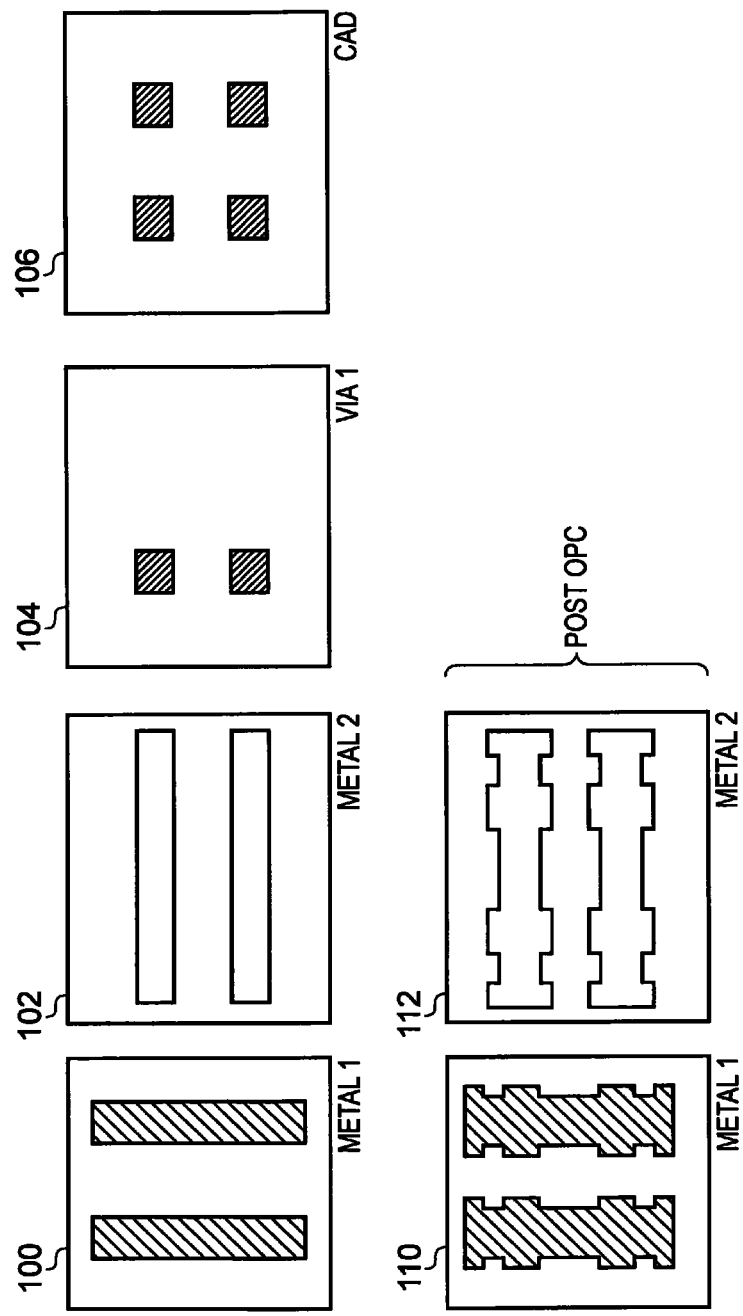
FIG. 3 schematically illustrates mask generation and modification for the ROM bit cell shown in FIG. 1 according to one embodiment.

FIG. 3 schematically illustrates a set of design layers 100, 102, 104, 106 which an integrated circuit designer could generate according to one embodiment of the present techniques in order to define a ROM bit cell for fabrication corresponding to ROM bit cell 10 in FIG. 1. It can be seen that the design layout 100 of the metal 1 layer corresponds directly to design layout 20 of metal 1 layer in FIG. 1, design layer 102 of the metal 2 layer corresponds directly to design layer 22 of the metal 2 layer in FIG. 1 and design layer 104 for via layer 1 corresponds directly to design layer 24 for via layer 1 in FIG. 1. However, in the example illustrated in FIG. 3, the definition of the integrated circuit (for example embodied on a computer-readable storage medium storing a gds2 file comprising these design layouts) further comprises an additional layer 106. This computer aided design (CAD) layer is a dummy (i.e. non-functional) design layer which is associated with the design layer 104 for the via 1 layer and comprises all possible via positions for this portion of the via 1 layer. Accordingly, design layer 106 comprises four via positions corresponding to the four intersection points between metal 1 design layer 100 and metal 2 design layer 102.

Next, according to the present technique, the mask generation and modification procedure carried out at the foundry in order to produce masks for the fabrication of the metal 1 layer and the metal 2 layer are performed such that the OPC procedure which modifies the metal 1 and metal 2 masks to take account of the via positions in via layer 1 is performed with reference to the non-functional dummy design layer 106 instead of with reference to the actual via 1 design layer 104. Accordingly, masks 110 and 112 are generated in which the enlargements of portions of the metal 1 layer and metal 2 layer are carried out with respect to all possible positions for vias in this portion of the via 1 layer, resulting in 4 enlargements in metal 1 mask 110 and four corresponding enlargements in the metal 2 layer mask 112. The "hammerhead" enlargements at the corner of each metal feature are also present. The advantage of this technique is that if the system designer wishes to reprogram the content of this ROM bit cell (as discussed with reference to the change from configuration 10 to configuration 40 from FIG. 1 to FIG. 2) only the mask corresponding to the via 1 layer needs modification and the previously generated metal 1 layer mask 110 and the previously generated metal 2 layer mask 112 can still be used unamended. The significant cost associated with generating a new mask for a layer of the integrated circuit is thus avoided.

Figure 4:
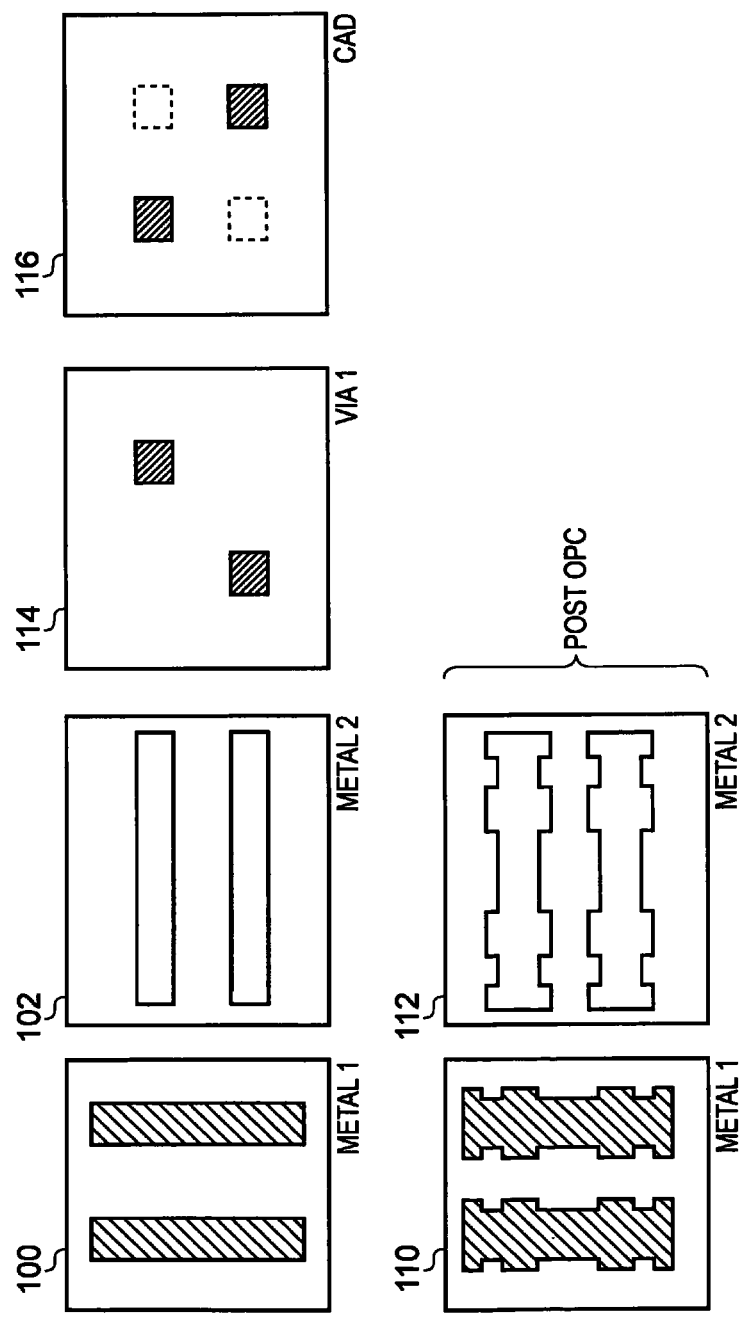
FIG. 4 schematically illustrates mask generation and modification for the ROM bit cell illustrates in FIG. 2 according to one embodiment.

FIG. 4 schematically illustrates the new configurations of the design layer 114 corresponding to the new programmed configuration 40 of the ROM bit cell (as in the FIG. 2 example). It can be seen that the metal 1 design layer 100 and the metal 2 design layer 102 have not changed. Due to the application of the present techniques in the example of FIG. 3 when the metal 1 layer mask 110 and the metal 2 layer mask 112 were first generated, it can be seen in FIG. 4 that these two masks 110 and 112 remain identical, despite the fact that the via 1 design layer 114 has been changed. FIG. 4 additionally illustrates an alternative approach to the provision of the CAD layer 106 in FIG. 3 in which this non-functional design layer is instead configured as shown in FIG. 4 as CAD layer 116 wherein the CAD layer 116 only represents possible via positions in via layer 1 which have not been used in the programmed design 114. Note that this change in the CAD layer 116 from the CAD layer 106 is unrelated to the above discussed change in "programmed content" of this ROM bit cell from the configuration shown in design layer 104 (FIG. 3) to that shown in design layer 114 (FIG. 4). Instead, this illustrates an alternative approach when initially generating the metal 1 layer mask 110 and the metal 2 layer mask 112 wherein the CAD layer 116 only comprises those via positions not used in the via 1 design layer. In this example, the OPC process carried out at the foundry would then take both via 1 design layer 114 and CAD layer 116 for the purposes of determining modifications required to the design layers 100 and 102 to generate the masks 110 and 112.

It may be observed that in reprogramming ROM bit cell 10 to become ROM bit cell 40 in the examples discussed above only three out of the four possible positions for the vias in this ROM bit cell have been used (i.e. the lower right position is not used). However, it should be appreciated that a typical configuration for multiple ROM bit cells places these adjacent to one another in an array of bit cells as schematically illustrated in FIG. 5 as ROM array 120. ROM bit cell 0 and ROM bit cell 1 are arranged directly adjacent to one another in this array, such that ROM bit cell 0 is formed at the intersection of metal 1 122 and metal 1 124 with metal 2 126 and 128, by the connections provided by vias 132 and 134. Conversely, ROM bit cell 1 is provided at the intersection of metal 1 122 and 124 with metal 2 128 and 130 by the connections provided by vias 134 and 136. In other words, via 134 is shared between ROM bit cell 0 and ROM bit cell 1. Accordingly, depending on the configuration of the ROM bit cell array, all four positions for vias can be used and should therefore be accounted for in the present techniques.

The present techniques are not limited to programmable subcomponents which are ROM bit cells, nor are they limited to that programmability being provided by the positions of vias. FIG. 6 gives an alternative example embodiment in which a transistor component provided by the relative positioning of metal structures 140 in a metal layer, poly structure 142 in a polysilicon layer and diffusion structure 144 in a diffusion layer, with the programmability of this component being dependent on the position of a contact 146, which connects the metal to the polysilicon 142. Depending on whether the contact is positioned at its illustrated position 146 or at its alternative position 148 configures this subcomponent into one of two logical configurations. Accordingly, in this embodiment the additionally provided (non-functional) CAD layer would comprise both possible positions 146 and 148 for the contact layer and the mask modification procedure carried out in the foundry for the generation of masks for fabrication of the poly layer and the diffusion layer would take this CAD layer comprising both contact positions as the contact layer definition for the purpose of the mask modification procedure (OPC). FIG. 7 illustrates yet another example wherein the programmability of a subcomponent depends on the positioning of structures within a diffusion layer. Hence, in the example illustrated in FIG. 7, the logical configuration of the subcomponent 160 illustrated depends on the presence or absence of the portion of the diffusion layer 156 which overlaps with the poly structure 154. The presence or absence of this portion of the diffusion layer 156 clearly enables or disables the usual functioning of the component formed from the set of structure 160. Accordingly, using the present techniques, when the integrated circuit comprising subcomponent 160 is first taped out, the foundry generates the masks for the illustrated poly layer, the illustrated diffusion layer and other (not illustrated) layers of the integrated circuit using a CAD layer corresponding to the diffusion layer which includes all three portions 150, 152 and 156 of the diffusion layer, such that the presence or absence of the portion of the diffusion layer 156 following a re-tape out to "reprogram" this subcomponent 160 will only affect the mask for the diffusion layer and not for any other layers of the integrated circuit.

Figure 8:
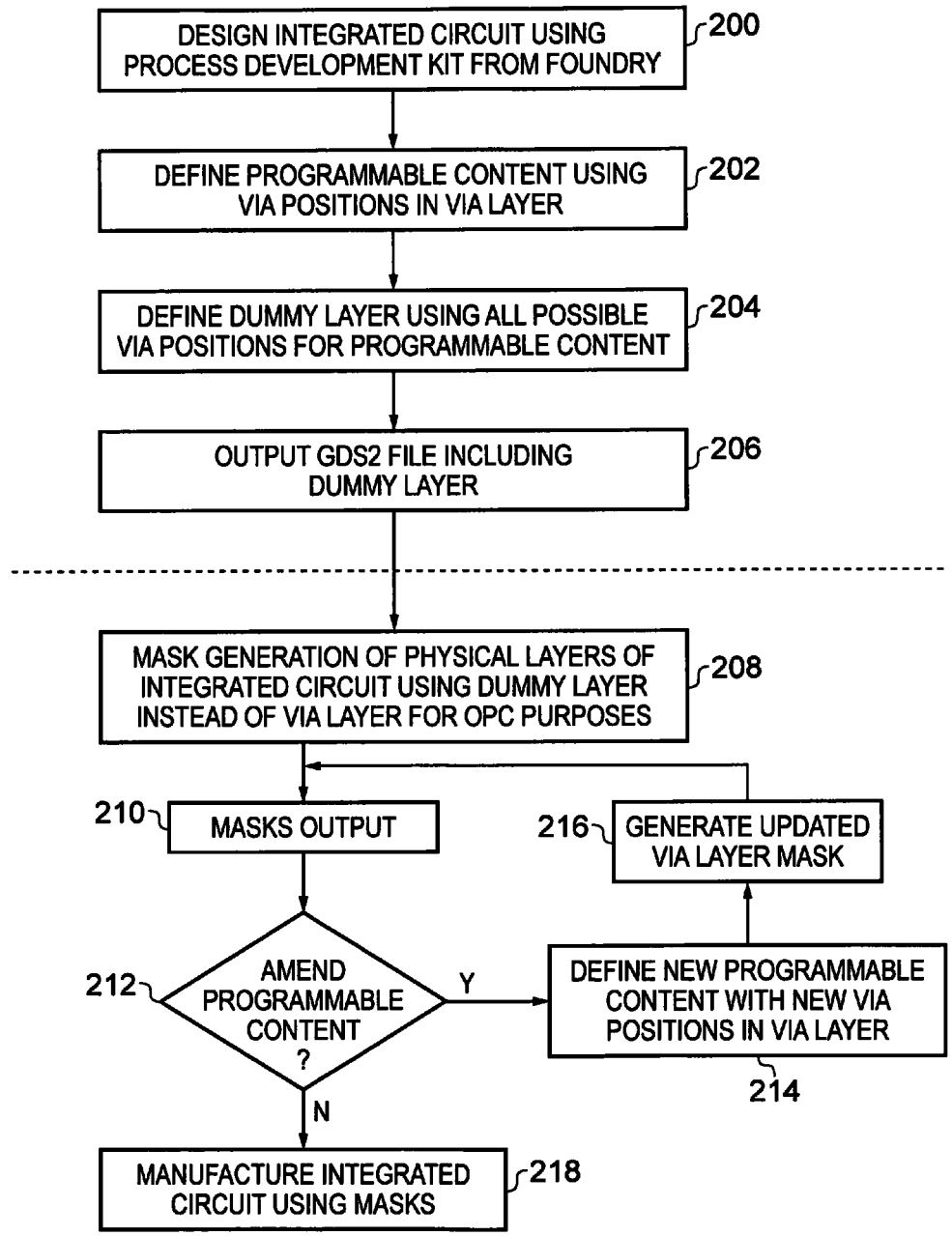
FIG. 8 schematically illustrates a series of steps which include mask generation according to one embodiment.

FIG. 8 schematically illustrates a series of steps which may be taken when implementing the present techniques. The flow begins at step 200 in which the integrated circuit designer designs an integrated circuit using the process development kit from the foundry. In accordance with the present techniques, this process development kit is configured such that the system designer is able to include the above mentioned non-functional ("dummy") layer in the definition of the integrated circuit. At step 202, the integrated circuit designer defines the programmable content of the programmable subcomponents, which in this example embodiment are ROM bit cells, the stored value in each being defined by the positions of vias in the via layer. Then at step 204 the integrated circuit designer can populate the dummy layer corresponding to the via layer using all possible via positions for programmable content. Then at step 206 when the initial layout of the integrated circuit is decided, the definition of the integrated circuit is output as a gds2 file which includes the dummy layer defined in step 204. This gds2 file is then passed to a foundry ("tape out") such that the integrated circuit may be manufactured. Accordingly, it will be appreciated that steps 204-206 represent those steps which are carried out by the integrated system designer.

Next, step 208 is the first step carried out in the foundry at which masks are generated corresponding to each physical layer of the integrated circuit. In particular, the dummy layer is used instead of the via layer for OPC purposes, as discussed above. Note that as discussed above, in other embodiments the dummy layer could be used in addition to the via layer (in dependence on its particular configuration). Then at step 210 the masks are output in a finalised form (either defined on a computer readable storage medium or physically embodied as the masks to be used for lithography). Then at step 212 it is determined if the programmable content (defined by the via positions in the via layer) is to be amended. If it is then the flow proceeds to step 214 where the system designer defines new programmable content for the programmable subcomponents of the integrated circuit by repositioning vias in the via layer. In the present example, where the programmable subcomponents of the integrated circuit are ROM bit cells, step 214 comprises importing a new ROM code file which defines the stored content of each ROM bit cell in order to translate this into new via positions in the via layer. Then at step 216 the foundry can generate an updated via layer mask, without updating any of the other previously generated masks. The flow then returns to step 210 where the masks are output. When no further programmable content amendment at step 212 is required then finally at step 218 the integrated circuit can be manufactured using the defined masks.

Figure 9:
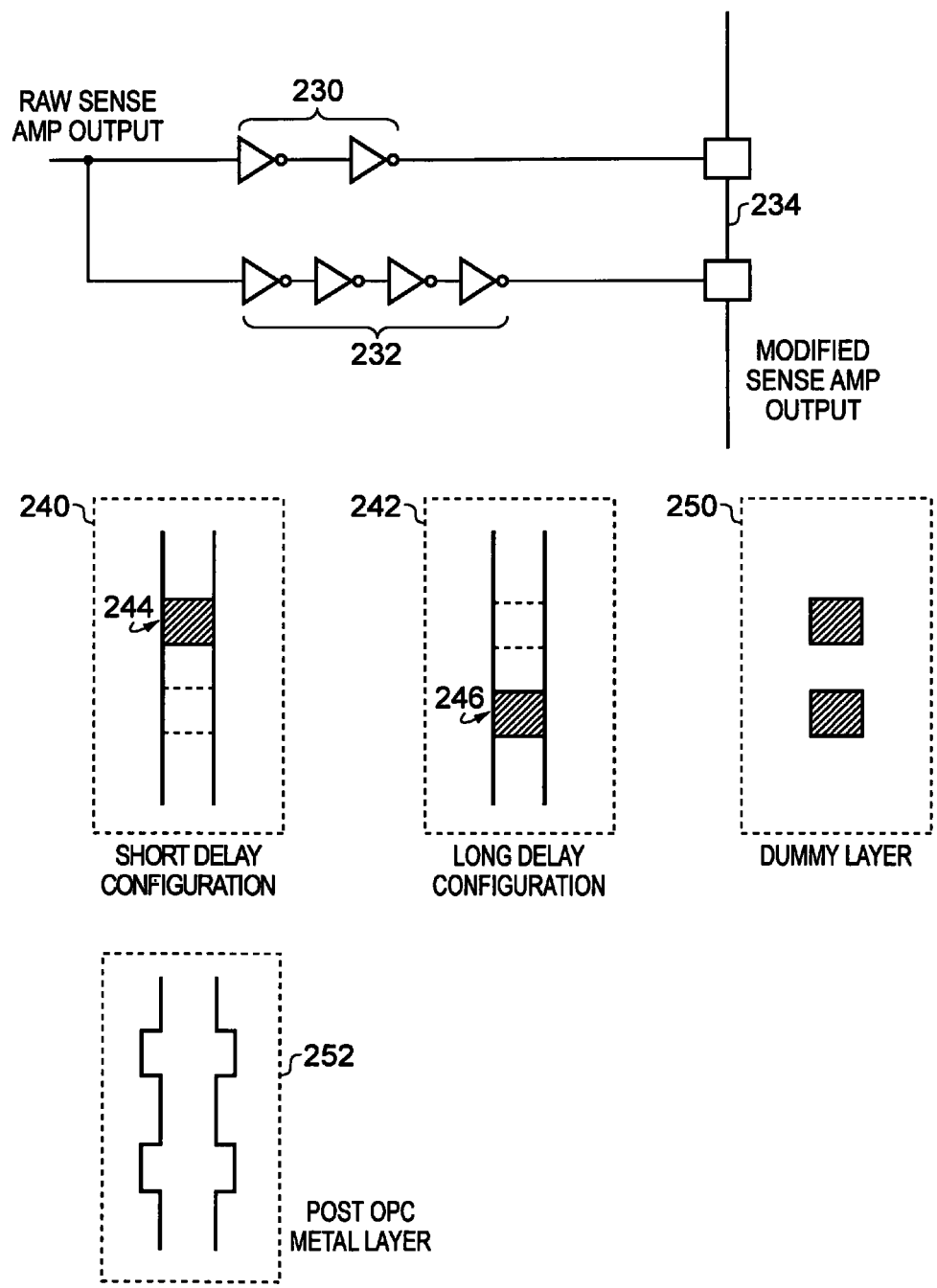
FIG. 9 schematically illustrates an embodiment in which the programmable subcomponent is a path selection structure used to select between different delay paths.

FIG. 9 schematically illustrates another context in which the present techniques may be implemented. This could for example be implemented in the context of SRAM output electronics in which the integrated circuit layout is initially taped out before a final decision has been made about the delay that is required on a sense amp output path. Accordingly, the output path is designed with a first delay path provided by the two inverters 230 and a parallel second delay path provided by the multiple inverters 232. Either of these may be coupled to the modified sense amp output path 234. Viewing the modified sense output path 234 as a structure in a metal layer of the integrated circuit, sections 240 and 242 of the design layout of the integrated circuit represent a "short delay" configuration and a "long delay" configuration in which a via is positioned at position 244 in the short delay configuration 240 and at position 246 in the long delay configuration 242. Accordingly, the CAD (dummy layer 250) introduced by the present techniques is as illustrated in FIG. 9 comprising the vias at both positions. Accordingly, after the mask generation procedure for the corresponding metal layer of the integrated circuit a metal layer mask 252 will result in which corresponding OPC enlargement to the metal layer at both possible positions for the via are generated. Accordingly, the system designer can adjust the delay on this sense amp output after tape out only at the cost of regenerating the mask for the via layer, without having to regenerate masks for other layers of the integrated circuit.

Figure 10:
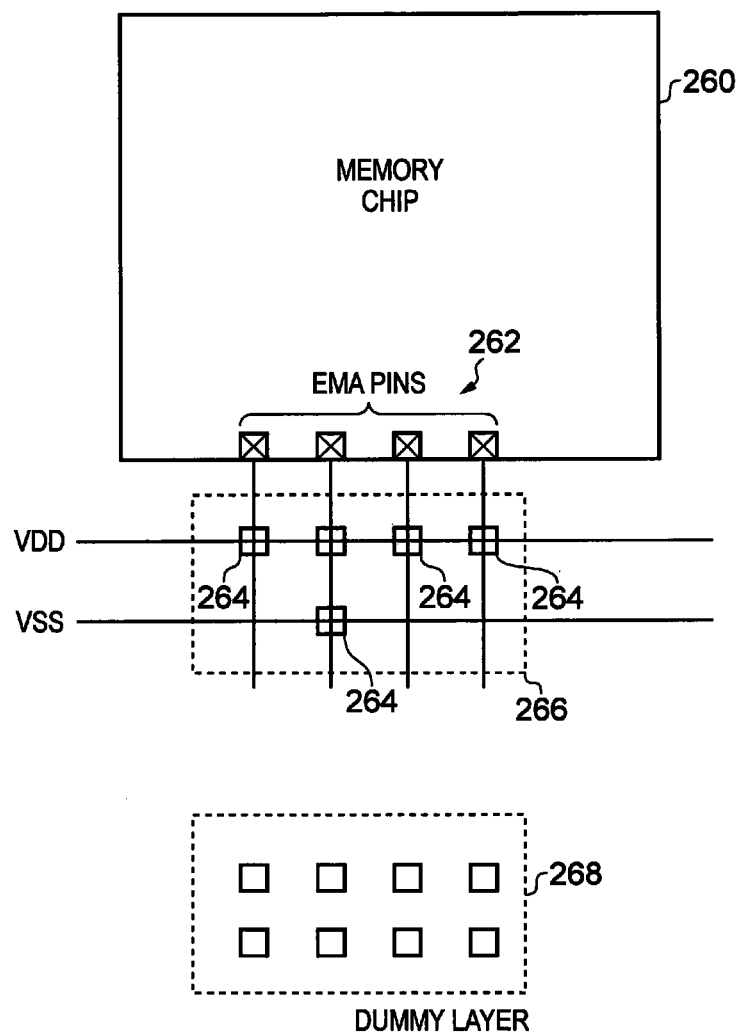
FIG. 10 schematically illustrates an embodiment in which the programmable subcomponent is a path selection structure used to connect EMA pins of a memory chip to different voltage connections.

FIG. 10 schematically illustrates yet another context in which the present techniques may be implemented. Memory chip 260 is configured as a SRAM device which is provided with Extra-Margin Adjust (EMA) pins 262. These EMA pins are configured to be coupled to different voltage supplies in dependence on the required configuration of the SRAM device. For example in the illustrated example embodiment, they may either be connected to VDD or to VSS. The coupling of the EMA pins to either VDD or VSS is determined by the positions of the vias 264, which couple the metal layer which connects to the EMA pins to the metal layer which connects to VDD/VSS. Hence, the positions of the vias 264 in the via layer section 266 will determine the voltage configuration of the EMA pins 262. Thus according to the present techniques, the CAD layer (dummy layer) 268 is provided which comprises all possible positions for the vias in this section of the via layer. In this way, after the mask generation procedure for the corresponding metal layers of the integrated circuit, metal layer masks will be produced in which corresponding OPC enlargement to the metal layers at all possible positions for the vias are generated. Accordingly, the system designer can tune the performance of the SRAM device by adjustment of the voltage connections to the EMA pins after tape out, only at the expense of a change to the via layer mask and not to the masks for the metal layers.

Figure 11:
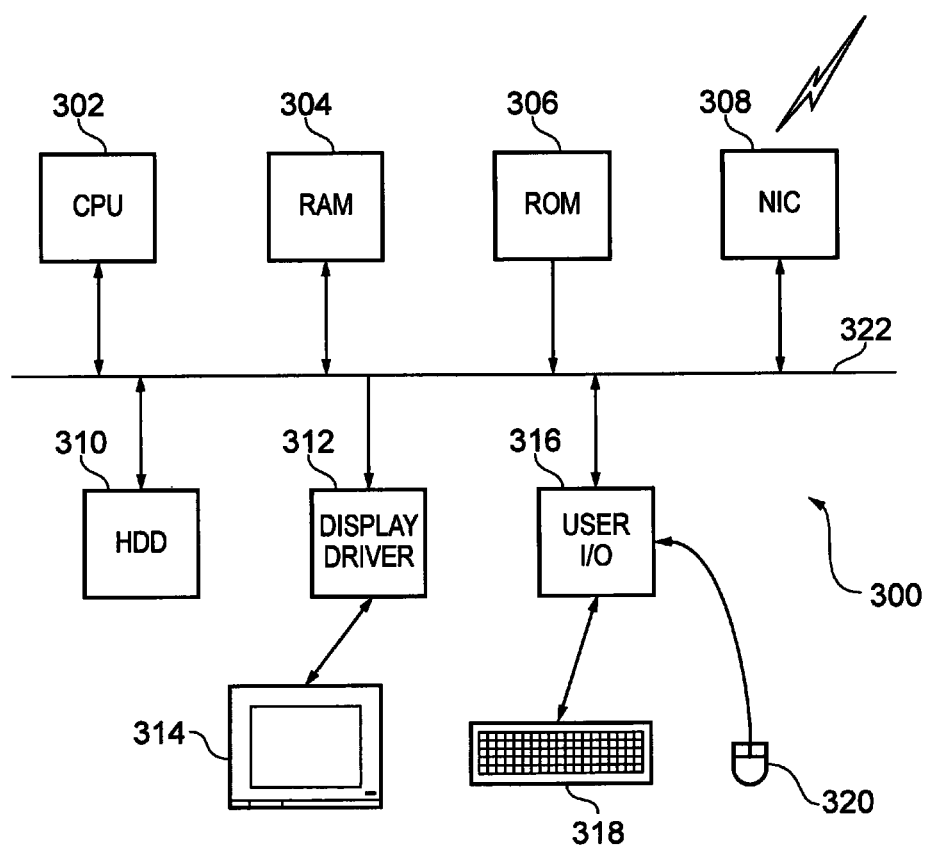
FIG. 11 schematically illustrates a generic computing device on which embodiments of the present invention may be implemented.

Finally, FIG. 11 schematically illustrates a general purpose computing device 300 of the type that may be used to implement the above described techniques. The general purpose computing device 300 includes a central processing unit 302, a random access memory 304 and a read only memory 306, connected together via bus 322. It also further comprises a network interface card 308, a hard disk drive 310, a display driver 312 and monitor 314 and a user input/output circuit 316 with a keyboard 318 and mouse 320 all connected via the common bus 322. In operation, such as when executing data processing instructions which include an instruction configured to cause the device to carry out the present techniques, the central processing unit 302 will execute computer program instructions that may for example be stored in the random access memory 304 and/or the read only memory 306. Program instructions could be additionally retrieved from the hard disk drive 310 or dynamically downloaded via the network interface card 308. The results of the processing performed may be displayed to a user via a connected display driver 312 and monitor 314. User inputs for controlling the operation of the general purpose computing device 300 may be received via a connected user input output circuit 316 from the keyboard 318 or the mouse 320. It will be appreciated that the computer program could be written in a variety of different computer languages. The computer program may be stored locally on a recording medium or dynamically downloaded to the general purpose computing device 300. When operating under control of an appropriate computer program, the general purpose computing device 300 can perform the above described techniques and can be considered to form an apparatus for performing the above described technique. The architecture of the general purpose computing device 300 could vary considerably and FIG. 11 is only one example.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of generating a mask for fabrication of a physical layer of an integrated circuit, wherein said integrated circuit comprises multiple physical layers, the method comprising the steps of:

receiving an input definition of said integrated circuit comprising multiple design layers, each design layer of said multiple design layers representing a designed layout of one of said multiple physical layers, wherein said multiple design layers comprise a programmable subcomponent configuration layer, said programmable subcomponent configuration layer representing a set of physical structures in a selected physical layer of said integrated circuit, wherein a position of each physical structure of said set of physical structures determines which of a plurality of logical configurations a programmable subcomponent of said integrated circuit will have;

performing a mask generation procedure on a selected design layer of said multiple design layers, said mask generation procedure comprising transforming said selected design layer into said mask for fabrication of said physical layer of said integrated circuit; and performing a mask modification procedure on said mask, said mask modification procedure comprising amending said mask to ensure that said physical layer of said integrated circuit will be reliably fabricated when using said mask, wherein said input definition of said integrated circuit further comprises a non-functional design layer, wherein said non-functional design layer does not represent one of said multiple physical layers, and wherein said non-functional design layer represents further possible positions for said set of physical structures in said selected physical layer, said further possible positions not being represented in said programmable subcomponent configuration layer, and wherein said mask modification procedure comprises treating said non-functional design layer as said programmable subcomponent configuration layer.

2. The method as claimed in claim 1, wherein said non-functional design layer represents all possible positions for said set of physical structures in said selected physical layer.

3. The method as claimed in claim 2, wherein said mask modification procedure comprises treating said non-functional design layer in place of said programmable subcomponent configuration layer.

4. The method as claimed in claim 1, wherein said mask modification procedure comprises treating said non-functional design layer in addition to said programmable subcomponent configuration layer.

5. The method as claimed in claim 1, wherein said programmable subcomponent configuration layer represents a via layer in said integrated circuit.

6. The method as claimed in claim 1, wherein said programmable subcomponent configuration layer represents a contact layer in said integrated circuit.

7. The method as claimed in claim 1, wherein said programmable subcomponent configuration layer represents a diffusion layer in said integrated circuit.

8. The method as claimed in claim 1, wherein said programmable subcomponent of said integrated circuit is a memory cell and said plurality of logical configurations correspond to values which may be stored in said memory cell.

9. The method as claimed in claim 8, wherein said memory cell is a read-only memory bitcell.

10. The method as claimed in claim 1, wherein said programmable subcomponent of said integrated circuit is a path selection structure and said plurality of logical configurations correspond to connection to a selected path amongst a plurality of paths.

11. The method as claimed in claim 10, wherein said plurality of paths comprises a range of delays.

12. The method as claimed in claim 10, wherein said plurality of paths comprises a range of voltage connections.

13. The method as claimed in claim 1, wherein said mask modification procedure comprises optical proximity correction.

14. The method as claimed in claim 1, wherein said set of masks for fabrication of said physical layers of said integrated circuit are configured for fabrication at a process node of 28 nm or below.

15. A computer-readable storage medium storing in a non-transitory fashion a representation of a mask generated according to the method as claimed in claim 1.

16. A mask for fabrication of a physical layer of an integrated circuit generated according to the method as claimed in claim 1.

17. A method of generating a layout design of an integrated circuit comprising multiple design layers, each design layer of said multiple design layers representing a designed layout of one of said multiple physical layers, the method comprising the steps of:

providing said multiple design layers comprising a programmable subcomponent configuration layer, said programmable subcomponent configuration layer representing a set of physical structures in a selected physical layer of said integrated circuit, wherein a position of each physical structure of said set of physical structures determines which of a plurality of logical configurations a programmable subcomponent of said integrated circuit will have; and providing said multiple design layers comprising a non-functional design layer, wherein said non-functional design layer does not represent one of said multiple physical layers, and wherein said non-functional design layer represents further possible positions for said set of physical structures in said selected physical layer, said further possible positions not being represented in said programmable subcomponent configuration layer, wherein a selected design layer of said multiple design layers is configured to be subjected to a mask generation and modification procedure comprising transforming said selected design layer into a selected mask for fabrication of a corresponding physical layer of said integrated circuit and amending said selected mask to ensure that a corresponding physical layer of said integrated circuit will be reliably fabricated when using said mask, wherein said mask generation and modification procedure comprises treating said non-functional design layer as said programmable subcomponent configuration layer.

18. A computer-readable storage medium storing in a non-transitory fashion a representation of a layout design of an integrated circuit generated according to the method as claimed in claim 17.

* * * * *